May 5, 1964 G. SMITH 3,132,302

PULSE GENERATOR AND SHAPER TO ELIMINATE UNDESIRABLE WAVE COMPONENTS OF SWITCH PRODUCED PULSES

Filed April 25, 1960 2 Sheets-Sheet 1

INVENTOR
GERALD SMITH
BY [signature]
ATTORNEY

INVENTOR
GERALD SMITH
BY [signature]
ATTORNEY

United States Patent Office 3,132,302

Patented May 5, 1964

3,132,302

PULSE GENERATOR AND SHAPER TO ELIMINATE UNDESIRABLE WAVE COMPONENTS OF SWITCH PRODUCED PULSES

Gerald Smith, Scranton, Pa., assignor, by mesne assignments, to Daystrom, Incorporated, Murray Hill, N.J., a corporation of Texas Filed Apr. 25, 1960, Ser. No. 24,555

4 Claims. (Cl. 328—59)

This invention relates to circuitry for providing electrical pulses and more particularly to such circuitry for producing pulses which are unmodulated by any undesirable electrical phenomenon associated with their generation.

It is often desirable to generate electrical pulses by means which inherently introduce various signal transients which interfere in some manner with proper operation of equipment or otherwise introduce various undesirable effects. This problem can be encountered in different ways, an example being when the initial pulses are generated by mechanical means such as a rotary switch comprising a moving rotor which makes electrical connection with a plurality of contacts spaced about the peripheral path of the rotor. When such a switch is used for generating the initial pulses, these pulses often include undesirable transient modulating components, due to effects known as switch "chatter" and "bounce," which result from the nature of the construction and operation of the switch.

Accordingly, it is an object of this invention to provide a circuit arrangement for producing, from an input pulse train which contains undesirable transient components in the various pulses, an output pulse train in which these components are entirely eliminated.

Another object is to provide circuitry capable of producing output pulses each having a time interval many times greater or less than the input pulses which are utilized in accomplishing the formation of the output pulses.

Briefly, the invention comprises a series of circuit stages coupled together for producing an output pulse train having predetermined characteristics when an input pulse train is coupled to one of the stages. More specifically, the circuit arrangement includes the following component circuits each having its output coupled to the next recited component circuit: an integrating network, first buffer stage, differentiating network, trigger stage, second buffer stage, pulse shaper stage, and buffer gate stage. The output of the buffer gate may be fed to a pulse distributor for dispatching various pulses to various circuits. An input pulse train is adapted to be supplied to the integrating network for actuating the various component circuits.

The various stages comprise appropriate circuitry employing either electron discharge devices or semiconductors, each stage being in either a substantially conductive or non-conductive state as required. When input pulses are applied to the integrating network, the various stages which are normally substantially non-conductive become substantially conductive, and those which are normally substantially conductive become non-conductive to thereby produce a train of output pulses from the buffer gate stage.

All of the objects, features and advantages of the invention will be best understood from a study of the following detailed description, taken in conjunction with the claims and with the drawings in which:

Figure 1:
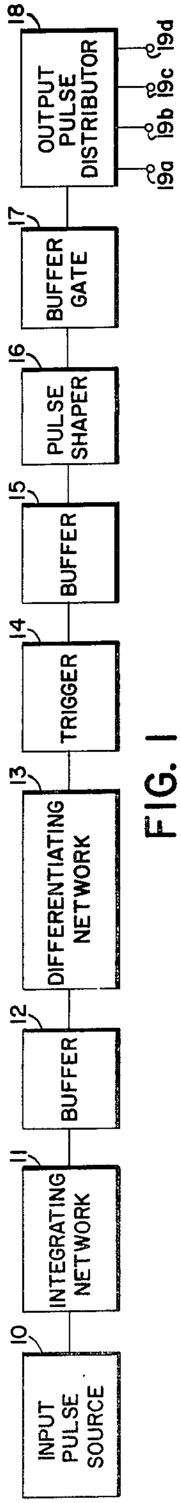
FIGURE 1 shows in block from the various individual circuit functions or stages of a circuit arrangement for carrying out the principles of the invention.
Figure 2:
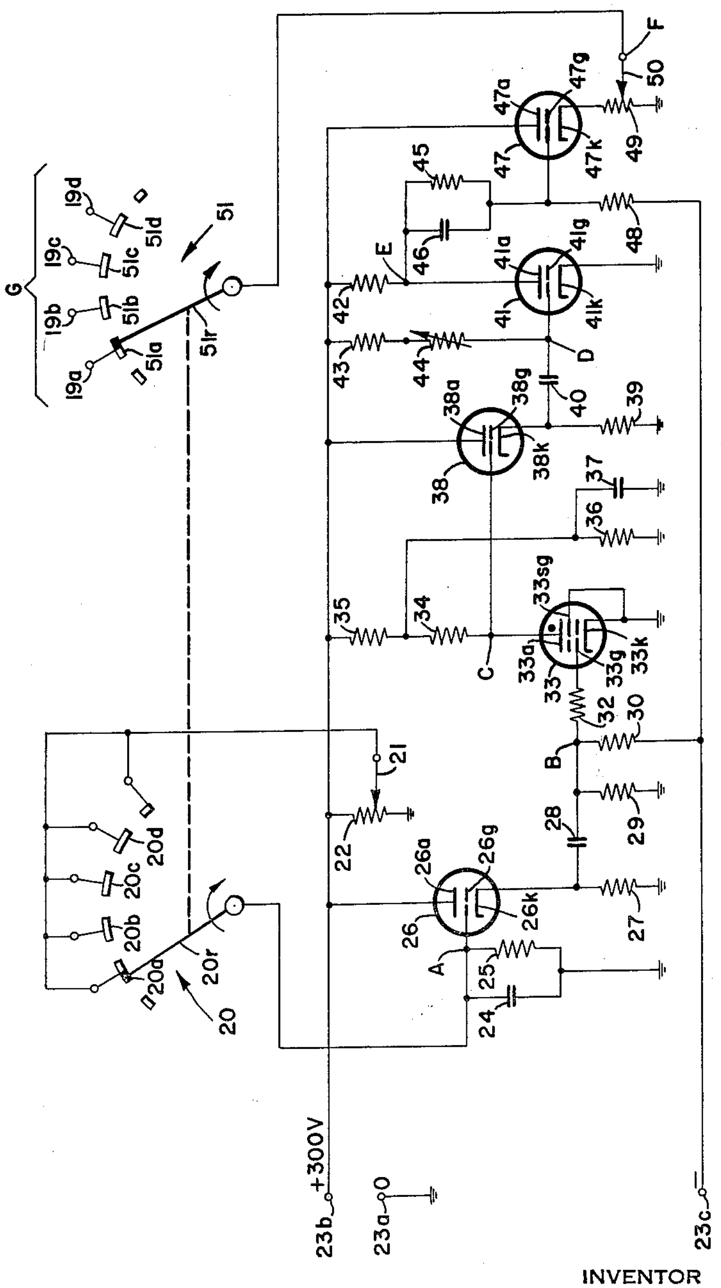
FIGURE 2 shows a schematic wiring diagram of one arrangement in accordance with the block diagram of FIGURE 1.

Referring now to FIGURES 1 and 2 there is shown in FIGURE 1 an input pulse source 10 which includes in FIGURE 2 a rotary switch 20 and its associated circuitry. This switch comprises a rotor **20*r* having stationary contacts 20*a*, 20*b*, 20*c*, 20*d*, etc., positioned around the peripheral path of travel of the rotor so as to be in sequential electrical contact therewith as the rotor is rotated. These contacts are all connected to each other and are also connected to the arm 21 of a potentiometer 22. The ends of this potentiometer are connected by means of a suitable wire and ground connection across a pair of potential terminals 23*a* and 23*b* which supply operating power to the circuit of FIGURE 2, the terminal 23*b* being approximately 300 volts positive with respect to the ground terminal 23*a***.

The rotor **20*r* of the switch is connected to an integrating network 11 which comprises a capacitor 24 and resistor 25 connected in parallel. It will be observed that as the rotor 20*r* of the switch is rotated, pulses will be produced at the point A of FIGURE 2 by reason of current passing from the positive terminal 23*b*, through a portion of the potentiometer 22, the arm 21, the appropriate switch contact 20*a*, 20*b*, etc., of the switch 20, the switch rotor 20*r*, the resistor 25 of the integrating network to ground and then to the ground terminal 23*a*. The switch 20** may be rotated at a constant speed by any suitable means such as, for example, a motor in order to produce the desired input pulse frequency.

The input pulse signals from the integrating circuit 11 are applied to the control grid electrode **26*g* of a tube 26 which, together with its associated circuitry, comprises a first buffer stage 12. The anode 26*a* of this tube is connected to the positive terminal 23*b* and the cathode 26*k* is connected to ground potential through a cathode resistor 27. The buffer 12 is connected as a cathode follower circuit and the output of this stage therefore appears across the resistor 27**.

The output which appears across the cathode resistor 27 is fed to a differentiating network 13 which comprises a capacitor 28 and resistors 29 and 30. These two resistors also serve as a voltage divider connected between the ground terminal **23*a* and a terminal 23*c* which is negative with respect thereto for impressing a suitable negative potential through a current limiting resistor 32 to the control grid 33*g* of a tube 33 which, with its associated circuitry, comprises a trigger stage 14**.

The tube 33 is preferably a control tube such as, for example, a gas-filled thyratron. The cathode **33*k* of this tube is connected to a suppressor grid 33*sg* and also to ground. The anode 33*a* of the tube is connected through resistors 34 and 35 to the positive terminal 23*b*. The resistor 34 is a current limiting resistor and the resistor 35 is the anode load resistor. The junction point between these two resistors is connected to ground through a resistor 36 and capacitor 37** connected in parallel. The resistors 35 and 36 in combination with the capacitor 37 form a first R-C time delay network and cooperate with the thyratron tube 33 and also with a second time delay network yet to be described for establishing various desired pulse duration intervals, as will later appear.

The output of the trigger tube 33 is directly connected by means of a suitable wire to the control grid 38*g* of a suitable tube 38, which together with its associated circuitry, comprises a second buffer stage 15. This buffer stage is interposed between the trigger stage 14 and a pulse shaping stage 16. The anode 38*a* of the tube 38 is connected directly to the positive terminal 23*b* and the cathode 38*k* is connected through a resistor 39 to ground. The buffer tube 38 is connected as a cathode follower, as is also the first buffer tube 26, and the output therefore appears across the cathode resistor 39.

The output of the buffer tube 38 is fed through a suitable capacitor 40 to the control grid electrode 41*g* of a tube 41 which, together with its associated circuitry, comprises the pulse shaping stage 16. The cathode 41*k* of this tube is connected to ground. The anode 41*a* is connected through a suitable anode load resistor 42 to the positive terminal 23*b*. A series network comprising a fixed resistor 43 and a variable resistor 44 is connected between the positive terminal 23*b* and the control grid electrode 41*g* of the tube 41. These two resistors along with the capacitor 40 and the resistor 39 comprise the second R-C time delay network which cooperates with the first R-C time delay network referred to above for establishing the desired pulse duration interval as will later appear.

The output of the pulse shaped tube 41 is conductively coupled through a resistor 45, which is bridged by a capacitor 46, to the control grid electrode 47*g* of a tube 47 which, together with its associated circuitry, comprises a buffer gate stage 17. The anode 47*a* of this tube is connected to the positive terminal 23*b*. A suitable resistor 48 is provided between the control grid 47*g* and the negative terminal 23*c* in order to apply a suitable negative potential to the grid 47*g* to render the tube 47 normally non-conductive. The cathode 47*k* of this tube is connected to ground through a suitable variable resistor 49. The arm 50 of this variable resistor is connected to an output pulse distributor 18, FIGURE 1. In FIGURE 2 the distributor is shown in the form of a rotary switch 51 similar to the switch 20, and having a rotor 51*r* and stationary contacts 51*a*, 51*b*, 51*c*, 51*d*, etc., equal in number to the contacts provided on the switch 20. The switch 51 and the switch 20 are ganged so that their respective rotors are rotated at the same angular velocity. Additionally, the contact on the free end of the rotor 51*r* is adapted to make electrical connection with the stationary contact 51*a* before the comparable contact on the rotor 20*r* makes connection with the stationary contact 20*a*. The same is true with respect to rotor contact traverse of the various contacts 51*b* and 20*b*, 51*c* and 20*c*, etc. As a result there is a phase displacement between the waveform pulses produced by these two switches. The various contacts on the output distributor switch 51 are connected by means of suitable wires to terminals 19*a*, 19*b*, 19*c*, 19*d*, etc.

Before the operation of the circuit of FIGURE 2 is described in detail, it should be noted that in the absence of input pulses at point A in FIGURE 2, the following conditions exist: the tube 26 of the buffer stage 12 is normally conductive, the thyratron 33 of the trigger stage 14 is normally non-conductive, the tube 38 of the buffer stage 15 is normally conductive, the tube 41 of the pulse shaped stage 16 is normally conductive, and the tube 47 of the buffer stage 17 is normally non-conductive.

The operation of the circuit of FIGURE 2 will next be described with reference to FIGURES 1, 2, and 3. In connection with FIGURE 3, all waveforms and potentials above the line "O" are positive with respect to the ground terminal 23*a* and those below the line are negative with respect thereto.

When the rotor 20*r* of a switch such as the switch 20 not connected to the integrating network 24, 25 is rotated, a waveform 60 is produced having pulses of the general shape indicated by the numerals 61 and 62. The pulse 61 corresponds to the travel of the rotor contact over the stationary contact 20*a*, the pulse 62 corresponds to the travel of the rotor contact over the stationary contact 20*b*, etc. These pulses are shown in substantially ideal form, however, and are not representative in detail of the actual pulses produced. The actual shape of the pulses derived from the rotor 20*r*, when the rotor is not connected to the integrating network 24, 25, is more accurately represented by the pulses 61′ and 62′ of the waveform 63, which contains transients such as those indicated at 64, these transients being in the nature of potential spikes due to "bounce," and "chatter," etc., of the switch contacts. These transient potential spikes 64 seriously interfere with proper operation of certain equipment with which the pulses are used.

Figure 3:
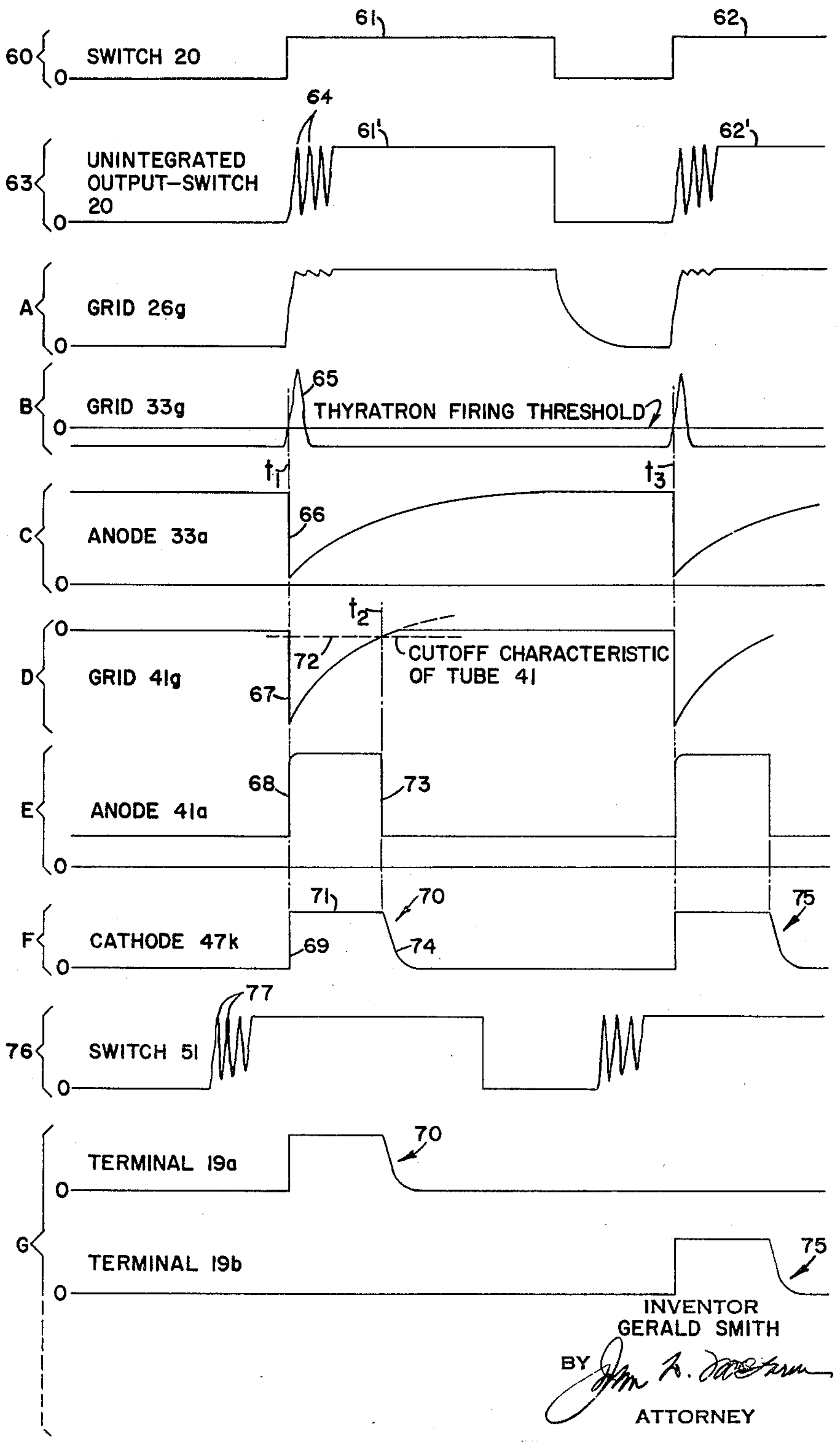
FIGURE 3 shows a series of waveforms at various points of the schematic wiring diagram of FIGURE 2.

When the input pulse signals 61′, 62′ are fed to the integrating network 11 comprising the capacitor 24 and resistor 25, the troughs between the spikes 64 are substantially eliminated by the action of this network and the pulses appearing at the point A in FIGURE 2 are shown by the waveform A in FIGURE 3. These pulses are fed to the control grid of the first buffer stage tube 26 which isolates the integrating network 11 from the differentiating network 13. The action of this differentiating network produces the single sharp potential spike 65 shown by the waveform B in FIGURE 3 each time the rotor 20*r* traverses one of the stationary contacts of the switch 20. The potential spike 65 is positive and has a sufficient value to overcome the negative potential on the thyratron control grid 33*g* from the negative terminal 23*c*, causing the thyratron 33 to fire. The thyratron fires at a time $t_1$, which is the point at which the leading edge of the potential spike 65 reaches the point of zero potential. This point is a very brief time after the initiation of the pulses 61 and 61′. When the thyratron fires, a sharp drop in potential is produced at the anode 33*a* of the thyratron 33. This sharp drop is indicated by the vertical line 66 of the waveform C in FIGURE 3. Almost immediately after the thyratron fires, it becomes extinguished since the anode current drops below the value necessary to sustain conduction.

The negative potential shift resulting from the drop in positive potential at the anode 33*a* of the thyratron is directly coupled to the control grid 38*g* of the second buffer tube 38 and results in a negative potential shift across the cathode output resistor 39. Further, at time $t_1$, the negative potential shift from the cathode output resistor 39 of the buffer tube 38 is transmitted through the capacitor 40 to the control grid electrode 41*g* and renders this tube which is in a normally conductive state, non-conductive. The waveform on the control grid 41*g* is shown at D in FIGURE 3 where it will be seen that the negative potential shift 67 follows the potential shift 66 of waveform C.

At time $t_1$ when the pulse shaper tube 41 becomes nonconductive, the potential at the anode 41*a* of this tube become more positive. This potential rise, shown by the vertical line 68, waveform E, is transmitted through the resistor 45 to the control grid 47*g* of the buffer gate tube 47 and is sufficiently positive to render this tube, which is normally in a non-conductive state, conductive. Accordingly, a potential rise, shown by the vertical line 69, waveform F, is produced between the potentiometer arm 50 of the potentiometer 49, and ground, and is the leading edge of the output pulse 70 beginning at time $t_1$ and shown in waveform F. This output pulse thus results from the tube 47 becoming conductive. The width or time duration of the pulse 70 is, however, a function of the time period during which the pulse shaper tube 41 remains non-conductive. This tube will remain nonconductive until the effects of the potential change across the second buffer tube cathode resistor 39 resulting from the thyratron anode potential shift 66, waveform C, become sufficiently dissipated so that the grid 41*g* is no longer biased below cutoff. This will happen at some time $t_2$ when the potential on the grid 41*g* reaches the cutoff characteristic line 72 of the tube 41, see waveform D. When this occurs the potential at the anode 41*a* will become less positive by reason of the anode current passing through the resistor 42, the pulse's trailing edge 73, waveform E, will be produced, and the buffer gate tube 47 will then become non-conductive, thus producing the trailing edge 74 of the output pulse 70.

The time $t_2$ at which this will occur depends upon the time constant of the first time delay network comprising the resistors 35 and 36 and the capacitor 37, since this affects the potentials waveform C, at the thyratron anode, and thus the potential applied to the grids 38*g*, 41*g* and 47*g*. It also depends upon the time constant of the second time delay network comprising the capacitor 40 and resistors 39, 43 and 44 since this affects the time interval within which the charge change on the capacitor 40 resulting from the firing of the thyratron can become sufficiently dissipated for the potential on the grid of the tube 41 to rise in a positive direction above its cutoff value. The resistor 44 is made variable so that the time constant of the second time delay circuit can be varied and thus vary the time interval between $t_1$ and $t_2$ and hence the width of the output pulses.

It should be noted that in certain applications in which a square wave might be applied to the trigger stage that the pulse width would be determined solely by the time constant of the second time delay network rather than being dependent upon both the first and second time delay networks.

The above description results from the application of the input pulse 61′ to the point A of FIGURE 2 which causes the formation of the output pulse 70. The application of the pulse 62′ will produce a second output pulse 75 beginning at time $t_3$, waveform F. The process will be repeated so long as input pulses are applied.

The waveforms shown at G in FIGURE 3 show the waveforms that would appear on the various output wires of the output switch 51. Accordingly, the first output pulse 70 shown at F would appear at the terminal 19*a*; the second output pulse 75 which began at time $t_3$ would appear at the terminal 19*b*, etc.

It will be noted from the waveform 76 that the contact of the rotor 51*r* with the stationary contacts 51*a*, 51*b*, etc., of the switch 51 is considerably advanced in phase, as explained earlier. This is done so that the switching transients 77 due to "chatter" and "bounce" which would ordinarily affect the output pulses 70, 75, etc., will have died out before these pulses begin at times $t_1$, $t_3$, etc., respectively, when the buffer gate tube 47 becomes conductive.

It has been found that the invention works satisfactorily with the second buffer stage 15 eliminated, and accordingly, this stage is unnecessary in usual applications. It should also be observed that the first buffer 12, the integrator 11 and differentiator 13 can be eliminated if it is desired to form output pulses from a single spike potential type of input pulse such as that indicated, for example, by the pulse 65 at waveform B in FIGURE 3.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. Apparatus for generating electric pulses comprising integrating means coupled to a source of time spaced input pulses, buffer means coupled to receive an integrated signal from said integrating means, differentiating means coupled to receive an output signal from said buffer means, triggering means having a conductive and a non-conductive electric state and being coupled to receive a differentiated signal from said differentiating means, said triggering means being normally non-conductive in the absence of input signals applied to said integrating means and becoming conductive in response to said signals, pulse shaping means coupled to receive signals from said triggering means, said pulse shaping means being normally conductive in the absence of signals applied to said triggering means and becoming non-conductive when said triggering means becomes conductive to thereby produce a train of pulses in the output circuit of said pulse shaping means, and gating means normally non-conductive when said pulse shaping means is conductive and becoming conductive to thus supply a pulse in its output circuit when said pulse shaping means becomes non-conductive.

2. In combination, a source of input pulse signals, an electron flow device having a conductive and a normally non-conductive state and being connected to said source for rendering said device conductive in response to said signals, a first time delay network connected in the circuit of said electron flow device, pulse shaping means, a buffer stage connected to the output of said electron device for applying to said pulse shaping means signals from said electron flow device, said pulse shaping means being normally conductive in the absence of input pulses applied to said electron flow device and becoming non-conductive when said electron flow device becomes conductive to thereby produce a train of pulses in the output circuit of said pulse shaping means, a second time delay network connected in the circuit of said pulse shaping means, and gating means coupled to said pulse shaping means, said gating means being normally non-conductive when said pulse shaping means is conductive and becoming conductive in response to said pulses developed in the output circuit of said pulse shaping means to thus develop a train of pulses in its output circuit.

3. In combination, a first means for developing a train of input pulses, integrating means coupled to said first means for receiving said pulses, buffer means coupled to receive an integrated signal from said integrating means, differentiating means coupled to receive an output signal from said buffer means, triggering means having a conductive and a non-conductive electric state and being coupled to receive a differentiated signal from said differentiating means, said triggering means being normally non-conductive in the absence of input pulses applied to said integrating means and becoming conductive in response to said pulses, pulse shaping means coupled to receive signals from said triggering means, said pulse shaping means being normally conductive in the absence of pulses applied to said triggering means and becoming non-conductive when said triggering means becomes conductive to thereby produce a train of pulses in the output circuit of said pulse shaping means, and gating means normally non-conductive when said pulse shaping means is conductive and becoming conductive when said pulse shaping means becomes non-conductive to thus develop a train of pulses in its output circuit, and distributor means having a plurality of output terminals, said latter means being synchronized with said first means to thereby produce an output pulse at each of said terminals in time relationship with said input pulses.

4. In combination, a first rotary switch including a plurality of arcuately spaced contacts and a rotor for traversing each contact, a source of potential connected to said first switch for developing a pulse each time said rotor traverses one of said contacts, an integrating circuit for receiving said pulses, a buffer circuit connected to the output of said integrating circuit, a differentiating circuit connected to the output of said buffer circuit, thyratron switching means connected to the output of said differentiating circuit and including a first time delay network, a pulse shaping circuit coupled to the output of said thyratron switching means and including a second time delay network, gating means connected to the output of said pulse shaping circuit for developing a train of output pulses, and a second rotary switch including a plurality of arcuately spaced contacts and a rotor for traversing each contact, the rotor of said second rotary switch being synchronized with the rotor of said first rotary switch for sequentially delivering output pulses to the terminals of said second switch in time relationship with the pulses developed by said first switch.

References Cited in the file of this patent

UNITED STATES PATENTS

| | | |
|---|---|---|
| 2,579,586 | Kroft | Dec. 25, 1951 |
| 2,935,609 | Rabin et al. | May 3, 1960 |
| 3,007,060 | Guenther | Oct. 31, 1961 |